United States Patent
Ishimaru

(10) Patent No.: US 7,432,542 B2
(45) Date of Patent: Oct. 7, 2008

(54) SEMICONDUCTOR DEVICE WITH ELECTROSTRICTIVE LAYER IN SEMICONDUCTOR LAYER AND METHOD OF MANUFACTURING THE SAME

(75) Inventor: Kazunari Ishimaru, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 11/443,430

(22) Filed: May 31, 2006

(65) Prior Publication Data

US 2006/0278903 A1    Dec. 14, 2006

(30) Foreign Application Priority Data

May 31, 2005    (JP)    ............................. 2005-159419

(51) Int. Cl.
*H01L 31/00* (2006.01)
*H01L 29/76* (2006.01)
*H01L 29/94* (2006.01)
*H01L 31/119* (2006.01)

(52) U.S. Cl. ....................... 257/289; 257/402; 257/418; 257/E27.006

(58) Field of Classification Search ................. 257/289, 257/402, 418, E27.006

See application file for complete search history.

(56) References Cited

U.S. PATENT DOCUMENTS

| | | | |
|---|---|---|---|
| RE32,859 E * | 2/1989 | Marshall et al. | 333/151 |
| 2007/0128827 A1* | 6/2007 | Faris | 438/455 |
| 2007/0287233 A1* | 12/2007 | Zhan et al. | 438/149 |

OTHER PUBLICATIONS

Thompson, S., et al., "A 90 nm Logic Technology Featuring 50nm Strained Silicon Channel Transistors, 7 layers of Cu Interconnects, Low k ILD, and 1 um$^2$ SRAM Cell", IEDM Tech. Dig., pp. 61-66 (2002).

Ghani, T., et al., "A 90 nm High Volume Manufacturing Logic Technology Featuring Novel 45nm Gate Length Strained Silicon CMOS Transistors", IEDM Techn. Dig., pp. 978-980 (2003).

Hoyt, J. L., et al., "Strained Silicon MOSFET Technology", IEDM Tech. Dig., pp. 23-26 (2002).

* cited by examiner

*Primary Examiner*—Ngan Ngo
(74) *Attorney, Agent, or Firm*—Foley & Lardner LLP

(57) ABSTRACT

A semiconductor device includes a first semiconductor layer, and a first insulated-gate field-effect transistor of a first conductivity type that is provided in a major surface region of the first semiconductor layer. The semiconductor device further includes an electrostrictive layer that is provided on a back surface of the first semiconductor layer and applies a first stress along a channel length to a channel region of the first insulated-gate field-effect transistor when the first insulated-gate field-effect transistor is operated.

12 Claims, 5 Drawing Sheets

SEMICONDUCTOR DEVICE WITH ELECTROSTRICTIVE LAYER IN SEMICONDUCTOR LAYER AND METHOD OF MANUFACTURING THE SAME

CROSS-REFERENCE TO RELATED APPLICATIONS

This application is based upon and claims the benefit of priority from prior Japanese Patent Application No. 2005-159419, filed May 31, 2005, the entire contents of which are incorporated herein by reference.

BACKGROUND OF THE INVENTION

1. Field of the Invention

The present invention relates to a semiconductor device including a MOS transistor, in which the mobility of electrons or holes is varied, for example, by applying a stress to a semiconductor layer.

2. Description of the Related Art

It is conventionally known that if a stress is applied to a substrate (or a semiconductor layer) in which a MOS transistor (MOSFET: Metal Oxide Semiconductor Field Effect Transistor) is provided, the mobility of electrons or holes is enhanced.

In the case of an nMOS transistor, if a tensile stress is applied in the channel direction, the mobility of electrons is enhanced. For instance, there is known a semiconductor device in which a liner silicon nitride film (SiN) is deposited on a silicon substrate and a stress is applied to the substrate from outside (see, e.g. S. Thompson et al., "A 90 nm Logic Technology Featuring 50 nm Strained Silicon Channel Transistors, 7 layers of Cu Interconnects, Low k ILD, and 1 um2 SRAM Cell," IEDM Tech. Dig., 2002, pp. 61-64). In this structure, however, only a tensile stress is applicable to the substrate. Thus, the effect is obtained with respect to only an nMOS transistor.

On the other hand, in the case of a pMOS transistor, if a compressive stress is applied in the channel direction, the mobility of holes is enhanced. For example, source/drain regions of the transistor are etched to form trenches. In the trenches, silicon germanium (SiGe) is epitaxially grown and buried, and a stress is applied to the substrate (see, e.g. T. Ghani et al., "A 90 nm High Volume Manufacturing Logic Technology Featuring Novel 45 nm Gate Length Strained Silicon CMOS Transistors," IEDM Tech. Dig., 2003, pp. 978-980). In this structure, however, only a compressive stress is applicable to the substrate. Thus, the effect is obtainable with respect to only a pMOS transistor.

Further, as an example of a technique in which a stress is applied to both the nMOS and pMOS, there is known a semiconductor device using a so-called "strained silicon (Si) substrate" (see, e.g. J. L. Hoyt et al., "Strained Silicon MOSFET Technology," IEDM Tech. Dig., 2002, pp. 23-26). In this semiconductor device, an epitaxially grown silicon germanium (SiGe) layer is provided on the silicon substrate. Taking advantage of the fact that the lattice constant of silicon germanium is greater than that of silicon, a stress is applied to the silicon substrate.

In this semiconductor device, however, a stress is always applied to the silicon substrate by the silicon germanium, and defects occur in the silicon substrate in order to release the stress. The density of defects is, e.g. $1E5/cm^2$ or more. If such defects are present in the depletion layer, the defects function as centers of generation of current, leading to generation of junction leak current.

In general, the concentration of germanium (Ge), which is necessary for formation of the silicon germanium, is about 20%, and the effect is obtainable only for an nMOS in this case. If a similar effect is to be obtained for a pMOS, the concentration of germanium (Ge) needs to be raised to 30% or more. If the germanium concentration is raised to 30% or more, however, the thickness of a silicon (Si) layer, which can be grown on the silicon germanium (SiGe) layer, becomes 10 nm or less, and it is difficult to form a p-type MOSFET. Thus, if nMOS's and pMOS's, to which stress is applied, are to be fabricated on the same substrate, the number of defective devices would increase and the yield of manufacture of LSIs would decrease.

BRIEF SUMMARY OF THE INVENTION

According to an aspect of the present invention, there is provided a semiconductor device comprising: a first semiconductor layer; a first insulated-gate field-effect transistor of a first conductivity type that is provided in a major surface region of the first semiconductor layer; and an electrostrictive layer that is provided on a back surface of the first semiconductor layer and applies a first stress along a channel length to a channel region of the first insulated-gate field-effect transistor when the first insulated-gate field-effect transistor is operated.

According to another aspect of the present invention, there is provided a method of manufacturing a semiconductor device, comprising: implanting impurities of a second conductivity type in a first semiconductor layer of a first conductivity type, thus forming a well region of the second conductivity type; forming an electrostrictive layer on the first semiconductor layer; forming a second semiconductor layer of the first conductivity type on the electrostrictive layer; forming a device isolation insulating layer in the first semiconductor layer, the device isolation insulating layer penetrating the second semiconductor layer and the electrostrictive layer; and forming a first insulated-gate field-effect transistor of the first conductivity type on the second semiconductor layer, and forming a second insulated-gate field-effect transistor of the second conductivity type on the second semiconductor layer that is located above the well region.

According to still another aspect of the present invention, there is provided a method of manufacturing a semiconductor device, comprising: implanting impurities of a second conductivity type in a first semiconductor layer of a first conductivity type, thus forming a well region of the second conductivity type; forming an electrostrictive layer on the first semiconductor layer; forming an insulating layer on a second semiconductor layer of the first conductivity type; turning a reverse surface and an obverse surface of the second semiconductor layer upside down, and attaching the insulting layer to the electrostrictive layer; forming a device isolation insulating layer in the first semiconductor layer, the device isolation insulating layer penetrating the second semiconductor layer, the insulating layer and the electrostrictive layer; and forming a first insulated-gate field-effect transistor of the first conductivity type on the turned second semiconductor layer, and forming a second insulated-gate field-effect transistor of the second conductivity type on the second semiconductor layer that is located above the well region.

DETAILED DESCRIPTION OF THE INVENTION

Figure 1:
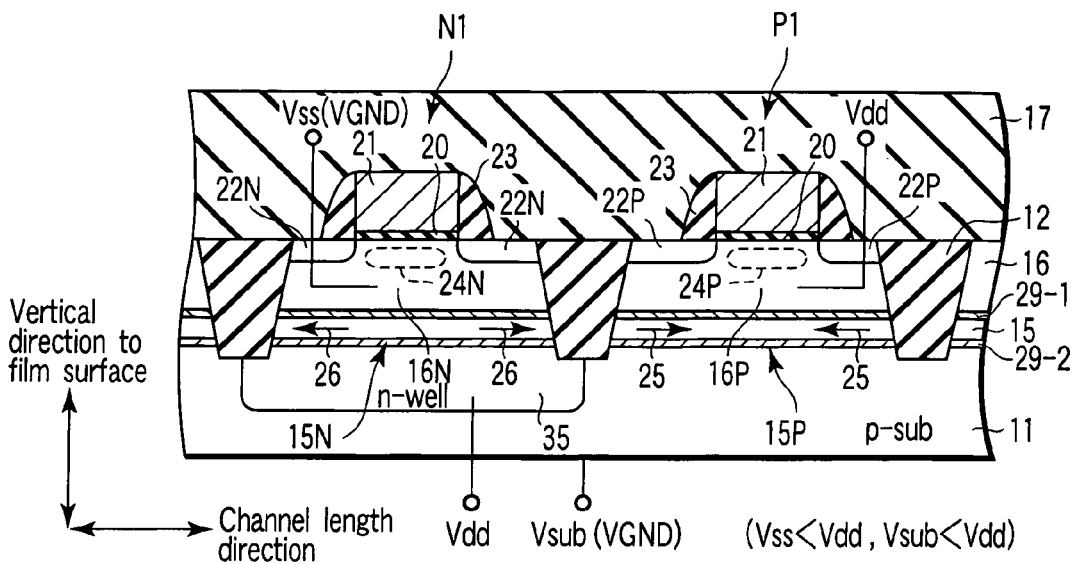
FIG. 1 is a cross-sectional view that shows a semiconductor device according to a first embodiment of the present invention.

Embodiments of the present invention will now be described with reference to the accompanying drawings. In the description below, common parts are denoted by like reference numerals throughout the drawings.

First Embodiment

Figure 2:
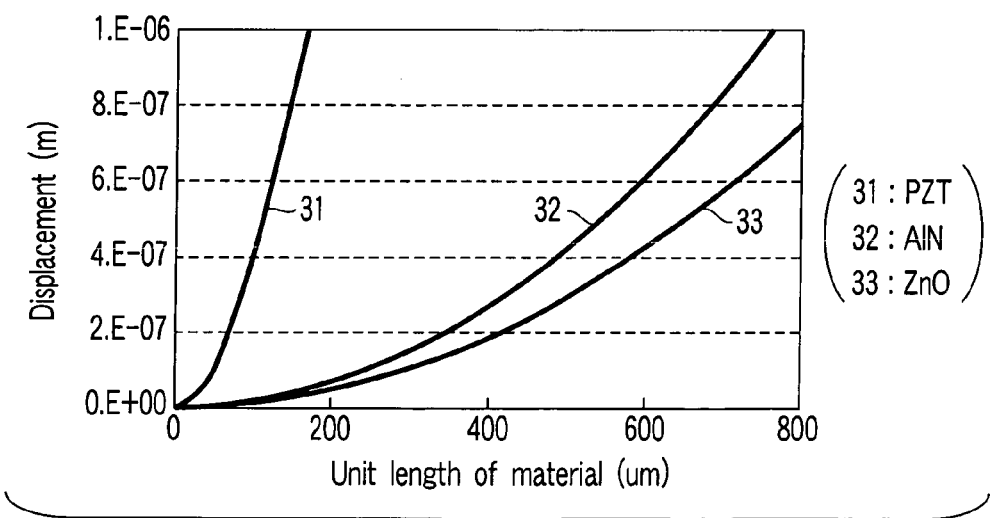
FIG. 2 is a graph showing a displacement of extension/contraction per unit length of piezoelectric material.
Figure 3:
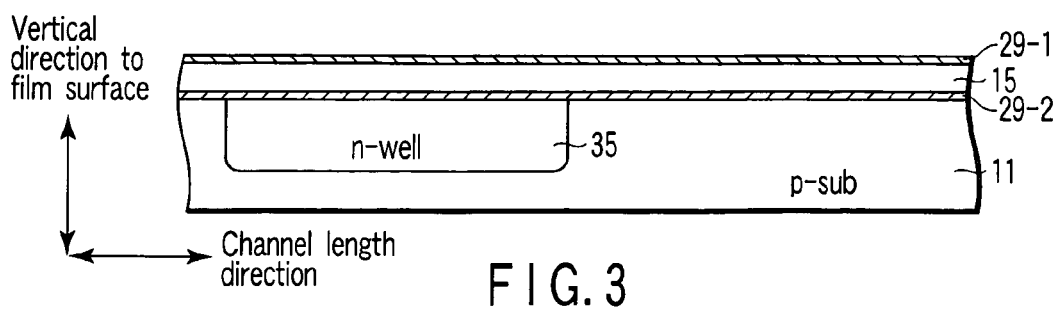
FIG. 3 is a cross-sectional view illustrating a fabrication step of the semiconductor device according to the first embodiment of the invention.

A semiconductor device according to a first embodiment of the invention is described referring to FIG. 1 and FIG. 2. FIG. 1 is a cross-sectional view that schematically shows the semiconductor device according to the first embodiment.

As is shown in FIG. 1, an electrostrictive layer 15 is provided on a p-type silicon layer 11. A lower electrode layer 29-1 and an upper electrode layer 29-2 are provided to cover lower and upper surfaces of the electrostrictive layer 15, respectively. Each of the electrode layers 29-1 and 29-2 is formed of, for example, Pt, Ti, SrRuO$_3$, or Ir, or a laminate of them. A p-type silicon layer 16 is provided on the electrostrictive layer 15. An insulating layer 12 is provided so as to penetrate the silicon layer 16 and electrostrictive layer 15, thus forming device isolation regions. In device regions over the silicon layer 16, an nMOS transistor N1 and a pMOS transistor P1 are provided. An interlayer insulation layer 17 is provided so as to cover the transistors N1 and P1.

The nMOS transistor N1 comprises a gate insulating film 20 that is provided on the silicon layer 16, a gate electrode 21 that is provided on the gate insulating film 20, source/drain regions 22N that are formed spaced apart in the silicon layer 16 so as to sandwich the gate electrode 21, and spacers 23 that are provided on side walls of the gate electrode 21.

The pMOS transistor P1 comprises a gate insulating film 20 that is provided on the silicon layer 16, a gate electrode 21 that is provided on the gate insulating film 20, source/drain regions 22P that are formed spaced apart in the silicon layer 16 so as to sandwich the gate electrode 21, and spacers 23 that are provided on side walls of the gate electrode 21.

The electrostrictive layer 15 is formed of a piezoelectric material. The piezoelectric material exhibits a so-called piezoelectric effect, by which the piezoelectric material undergoes deformation when it is exposed to an externally applied electric field. If an electric field is applied in a direction perpendicular to the surface of a film that is formed of the piezoelectric material, the film extends/contracts in a direction (channel length direction) perpendicular to the direction of the electric field. Thus, the electrostrictive layer 15 extends/contracts in the channel length direction by a voltage that is applied between an upper surface of the electrostrictive layer 15, which is located on the side where the transistors N1 and P1 are provided, and a lower surface of the electrostrictive layer 15, which is located opposite to the upper surface. Preferably, the piezoelectric material should be a ferroelectric material such as PZT (PbZr$_x$Ti$_{1-x}$O$_3$), aluminum nitride (AlN) or zinc oxide (ZnO).

Referring to FIG. 2, a displacement due to extension/contraction of each of the piezoelectric materials per unit length is explained. In FIG. 2, solid lines 31, 32 and 33 indicate displacements of PZT, aluminum nitride and zinc oxide, respectively.

As is shown in FIG. 2, PZT has the greatest extension/contraction displacement, and the piezoelectricity of PZT is most effective. However, PZT is generally susceptible to heat, and a thermal limitation (e.g. 600° C. or below) has to be set in the fabrication process. Thus, aluminum nitride, for instance, which is relatively free from the thermal limitation, may be chosen on an as-needed basis.

<Operation>

Next, the operation of the embodiment is described. To begin with, the operation of the pMOS transistor P1 is described. In the structure shown in FIG. 1, the electrostrictive layer 15 is not in contact with the source/drain 22P of the transistor P1. A potential is applied to the well region 16P, and the well region 16P is kept at a power supply voltage Vdd. In addition, a substrate voltage Vsub (ground potential VGND in this case) is applied to the silicon layer 11. Thus, the power supply voltage Vdd is applied to the upper side of the electrostrictive layer 15P, on which the transistor P1 is provided, and the ground voltage VGND (VGND<Vdd) is applied to the lower side of the electrostrictive layer 15P, and the electrostrictive layer 15P contracts in the channel length direction perpendicular to the direction of an electric field that is generated. As a result, the channel region 24P of the transistor P1 is strained by the electrostrictive layer 15P, and a compressive stress acts in the channel region 24P.

By applying a desired voltage to the drain region 22P and gate electrode 21, the transistor P1 is turned on.

As regards the nMOS transistor N1, the substrate voltage VGND is similarly applied to the silicon layer 11. An n-well region (n-well) 35, which is of a conductivity type opposite to the silicon layer 11, is formed between the electrostrictive layer 15 and silicon layer 11. A power supply voltage Vdd is applied to the n-well region 35. On the other hand, a well region 16N of the transistor N1 is kept at a ground voltage VGND. Thus, the ground voltage VGND is applied to the upper side of the electrostrictive layer 15N, on which the transistor N1 is provided, and the power supply voltage Vdd is applied to the lower side of the electrostrictive layer 15N. Thus, an electric field is applied in a direction opposite to the direction of the electric field applied to the transistor P1. As a result, the channel region 24N of the transistor N1 is strained by the electrostrictive layer 15N, and a tensile stress acts in the channel region 24N.

By applying a desired voltage to the drain region 22N and gate electrode 21, the transistor N1 is turned on.

According to the semiconductor device of this embodiment, the following advantageous effects (1) to (4) can be obtained.

(1) Occurrence of defects in the semiconductor substrate can be prevented, and a junction leak current can be reduced.

As has been stated above, there is no need to apply stress to, and strain, the semiconductor layer 16 of the transistor P1, N1 in advance. At the time of operation, a necessary stress may be applied to the semiconductor layer 16 of the transistor P1, N1. Thus, it is possible to suppress, for example, occurrence of defects in a substrate that uses a conventional SiGe virtual substrate and takes advantage of lattice strain, and to suppress an increase in resultant junction leak current.

(2) The mobility of electrons or holes in the transistor P1, N1 can be enhanced.

The electrostrictive layer 15 is provided between the semiconductor layers 11 and 16, and the pMOS transistor P1 and nMOS transistor N1 are provided on the silicon layer 16. The ground potential VGND is applied to the silicon layer 11 and the power supply voltage Vdd is applied to the well region 16P of the transistor P1. Thereby, a compressive stress is caused in the channel region 24P that is strained by the electrostrictive layer 15P.

Therefore, the mobility of holes in the transistor P1 can be enhanced.

In addition, the ground voltage VGND is applied to the silicon layer 11, the power supply voltage Vdd is applied to the n-well region 35 formed in the silicon layer 11 below the transistor N1, and the ground voltage VGND (=Vss) is applied to the well region 16N of the transistor N1. Thus, the electrostrictive layer 15N is strained in the channel length direction perpendicular to the direction of electric field. A tensile stress acts in the channel region 24N of the transistor N1, which is strained by the electrostrictive layer 15N.

Therefore, the inter-atomic distance of silicon in the channel region 24N increases and the effective mass of electrons decreases, and the mobility of electrons in the transistor N1 can be increased.

(3) Stresses in proper directions can be applied to the p-type and n-type transistors on the same substrate.

As has been described above, in accordance with the direction of electric field that is applied to the electrostrictive layer 15, a compressive stress can be applied to the pMOS transistor and a tensile stress can be applied to the nMOS transistor.

Stresses in proper directions can be applied to the p-type and n-type transistors on the same substrate 16. For example, this technique can easily be applied to a so-called CMOS inverter circuit. Furthermore, there is no need to form the nMOS transistor and pMOS transistor with different structures, and stresses in opposite directions can be applied by changing the manner of application of voltage. Therefore, the manufacturing process can be simplified, and the manufacturing cost can be reduced.

(4) Fine patterning can advantageously be performed.

A tensile stress or a compressive stress can be applied to the p-type transistor and n-type transistor by the single electrostrictive layer 15. For example, there is no need to vary the kinds of insulation films in association with the p-type transistor and n-type transistor. In addition, since operational power, such as a power supply voltage and a well voltage, are utilized, there is no need to provide a special voltage for extending/contracting the electrostrictive layer 15.

Therefore, fine patterning can advantageously be performed.

<Manufacturing Method>

A method of manufacturing the semiconductor device according to the present embodiment is described.

To start with, n-type impurities such as phosphorus (P) are implanted in a p-type silicon substrate (Si wafer) 11 by, e.g. ion implantation, and the n-type impurities are thermally diffused. Thus, an n-well region 35 is formed.

Then, Pt, Ti, $SrRuO_3$, or Ir is deposited on the substrate 11 and the n-well region 35 by, e.g. CVD (Chemical Vapor Deposition). Thus, a lower electrode layer 29-2 is formed.

PZT ($PbZr_xTi1-xO3$), for instance, is deposited on the lower electrode layer 29-2 by, e.g. CVD. Thus, an electrostrictive layer 15 is formed.

Pt, Ti, $SrRuO_3$, or Ir is deposited on the electrostrictive layer 15 by, e.g. CVD. Thus, an upper electrode layer 29-1 is formed.

Figure 4:
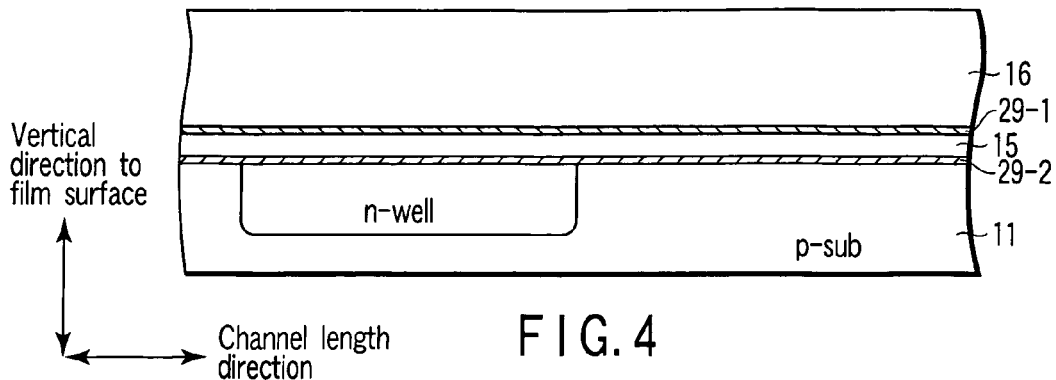
FIG. 4 is a cross-sectional view illustrating a fabrication step of the semiconductor device according to the first embodiment of the invention.

Then, as shown in FIG. 4, a p-type silicon layer 16, which is prepared separately, is attached to the upper electrode layer 29-1.

Figure 5:
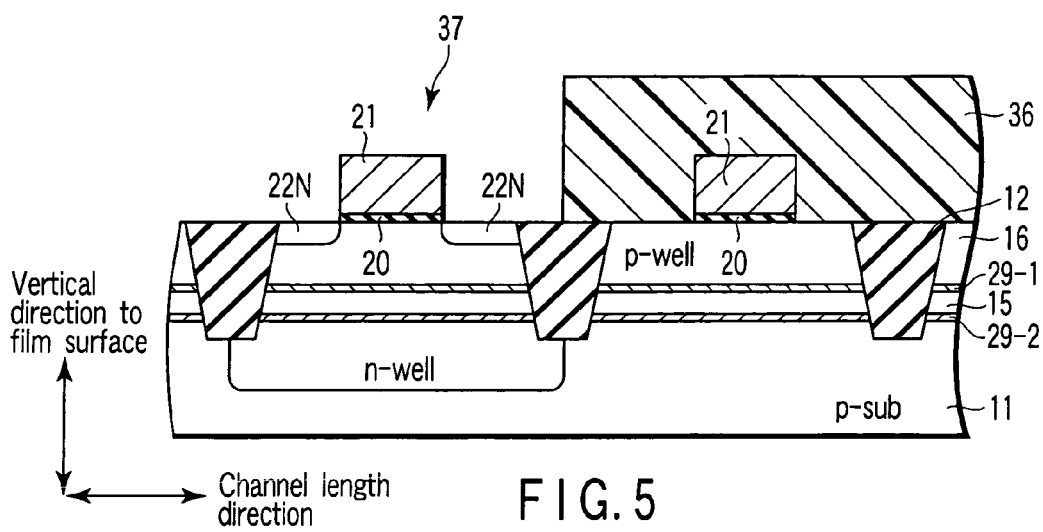
FIG. 5 is a cross-sectional view illustrating a fabrication step of the semiconductor device according to the first embodiment of the invention.

In a subsequent step illustrated in FIG. 5, the thickness of the silicon layer 16 is reduced to a predetermined thickness by, e.g. CMP (Chemical Mechanical Polishing) or a smart-cut method.

Using a conventional process, an insulating layer 12 is formed so as to penetrate the silicon layer 16 and electrostrictive layer 15. Further, using a conventional process, a gate insulating film 20 and a gate electrode 21 are formed on the silicon layer 16.

A photoresist 36 is coated on the entire surface, and the photoresist 36 is subjected to exposure and development. Thus, an opening 37, where a formation region of an nMOS transistor is exposed, is formed. Using the photoresist 36 with the opening pattern as a mask, n-type impurities such as phosphorus (P) are implanted in the silicon layer 16 by, e.g. ion implantation, and the n-type impurities are thermally diffused. Thus, source/drain regions 22N are formed.

After the photoresist 36 is removed, source/drain regions 22P are formed by the same process as that of forming the source/drain regions 22N.

Subsequently, using conventional process steps, spacers 23 and an insulation layer 17 are formed, and the semiconductor device shown in FIG. 1 is fabricated.

In the method of manufacturing the semiconductor device according to the present embodiment, even in the case where nMOS transistor N1 and pMOS transistor P1 are fabricated on the same semiconductor layer 16, there is no limitations relating to the film thickness and impurity concentrations for applying stress from outside. As a result, occurrence of defective devices can advantageously be suppressed, and the yield of LSIs can be enhanced.

The structure of the support substrate, which comprises the silicon layer 16/electrostrictive layer 15/silicon layer 11, is configured such that the electrostrictive layer 15 is substituted for an insulating layer in a so-called SOI (Silicon On Insulator) structure. Thus, the same fabrication steps as for the SOI structure may be adopted, where necessary.

Second Embodiment

Figure 6:
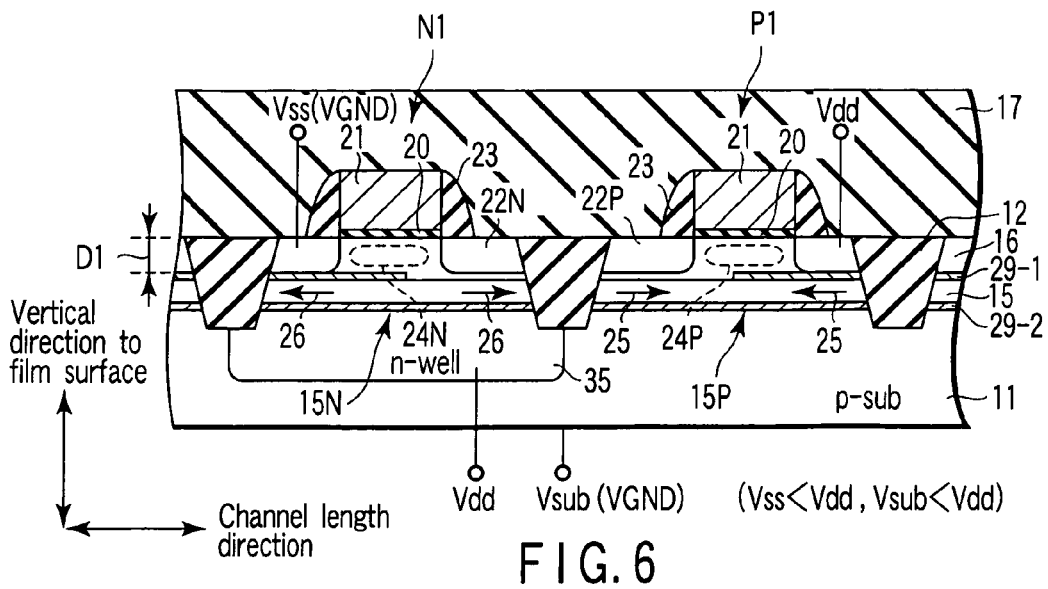
FIG. 6 is a cross-sectional view that shows a semiconductor device according to a second embodiment of the present invention.

Next, a semiconductor device according to a second embodiment of the invention is described with reference to FIG. 6. FIG. 6 is a cross-sectional view showing the semiconductor device of the second embodiment. A description of the parts, which are common to those in the first embodiment, is omitted.

As is shown in FIG. 6, the thickness D1 of a semiconductor layer 16 is made less than the thickness of the layer 16 in the first embodiment. In addition, the bottoms of the source/drain regions 22N and 22P are located on the upper surface of the electrostrictive layer 15. In other words, the thickness of the source/drain region 22N, 22P is about D1.

As mentioned above, the bottoms of the source/drain regions 22N, 22P are in contact with the upper surface of the electrostrictive layer 15. Thus, a voltage is directly applied to the upper surfaces of the electrostrictive layers 15N, 15P, without intervention of the well.

Specifically, a source voltage or drain voltage Vdd, which is produced when the transistor P1 is operated, is applied to the upper surface of the electrostrictive layer 15P. On the other hand, a substrate voltage VGND (<Vdd) is applied to the lower surface of the electrostrictive layer 15P. Thus, a desired compressive stress is applied to the channel region 24P.

A source voltage or drain voltage Vss (ground voltage VGND in this case), which is produced when the transistor N1 is operated, is applied to the upper surface of the electrostrictive layer 15N. On the other hand, a power supply voltage Vdd (>VGND) is applied to the lower surface of the electrostrictive layer 15N. Thus, a desired tensile stress is applied to the channel region 24N.

According to the structure of the present embodiment, the same advantageous effects (1) to (4) as with the first embodiment are obtained.

Furthermore, as described above, the voltage, which is to be applied to the electrostrictive layer 15P, 15N, is directly applied from the source/drain regions 22N, 22P, without intervention of the well. Thus, there is no need to form a terminal for supplying the well potential. Therefore, the device structure can advantageously be simplified.

Next, a method of manufacturing the semiconductor device according to this embodiment is described.

Using the same fabrication steps as in the first embodiment, an electrostrictive layer 15 is formed on the silicon layer 11, and a silicon layer 16 is formed on the electrostrictive layer 15.

Figure 7:
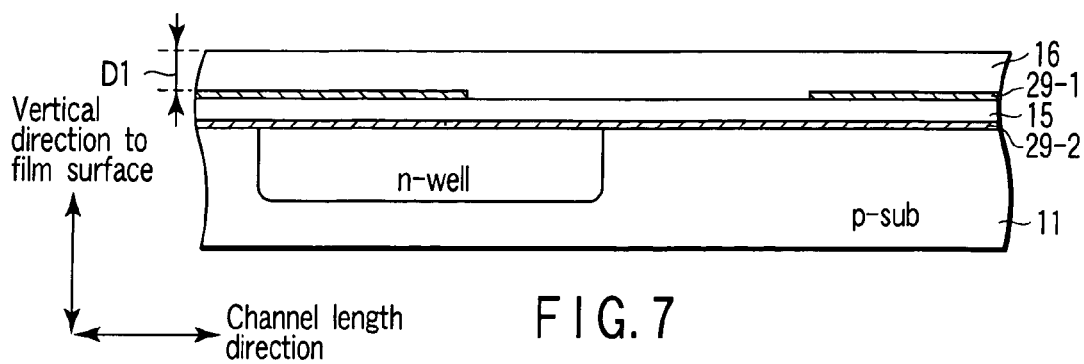
FIG. 7 is a cross-sectional view illustrating a fabrication step of the semiconductor device according to the second embodiment of the invention.

In a subsequent step illustrated in FIG. 7, the thickness of the silicon layer 16 is set to be about D1 by, e.g. CMP or a smart-cut method. In this step, the thickness D1 is made less than the thickness of the silicon layer 16 in the first embodiment, by choosing the conditions for reaction, such as reaction time.

Using a conventional process, an insulating layer 12 is formed so as to penetrate the silicon layer 16 and electrostrictive layer 15. Further, using a conventional process, a gate insulating film 20 and a gate electrode 21 (not shown) are formed on the silicon layer 16.

Figure 8:
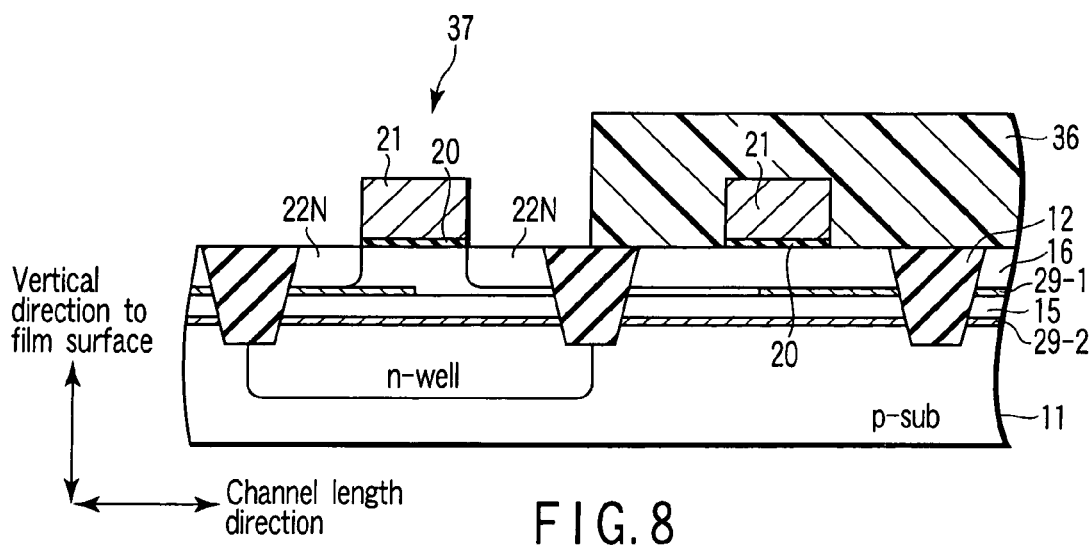
FIG. 8 is a cross-sectional view illustrating a fabrication step of the semiconductor device according to the second embodiment of the invention.

A photoresist 36 is coated on the entire surface, as shown in FIG. 8, and the photoresist 36 is subjected to exposure and development. Thus, an opening 37, where a formation region of an nMOS transistor is exposed, is formed. Using the photoresist 36 with the opening pattern as a mask, n-type impurities such as phosphorus (P) are implanted in the silicon layer 16 by, e.g. ion implantation, and the n-type impurities are thermally diffused. Thus, source/drain regions 22N are formed.

In this step of ion implantation, the bottoms of the source/drain regions 22N may be located on the upper surface of the electrostrictive layer 15, for example, by setting the application voltage at a high level. In this case, the thickness D1 would become substantially equal to the thickness of the silicon layer 16 in the first embodiment.

After the photoresist 36 is removed, source/drain regions 22P are formed by the same process as that of forming the source/drain regions 22N.

Subsequently, using conventional process steps, spacers 23 and an insulation layer 17 are formed, and the semiconductor device shown in FIG. 6 is fabricated.

In the method of manufacturing the semiconductor device according to the present embodiment, the same advantageous effects as with the first embodiment can be obtained.

Third Embodiment

Example in which an Insulating Layer is Provided Between Silicon Layer 16 and Electrostrictive Layer 15

Figure 9:
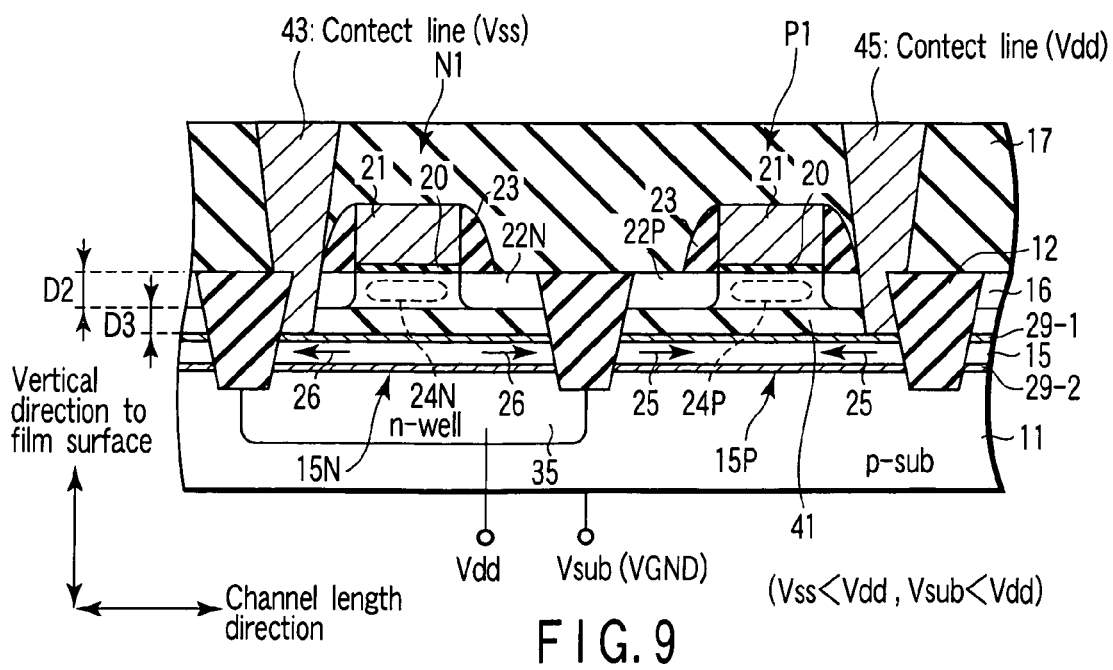
FIG. 9 is a cross-sectional view that shows a semiconductor device according to a third embodiment of the present invention.

Next, a semiconductor device according to a third embodiment of the invention is described with reference to FIG. 9. FIG. 9 is a cross-sectional view that shows the semiconductor device according to the third embodiment. A description of the parts, which are common to those in the second embodiment, is omitted.

The semiconductor device of the third embodiment differs from that of the second embodiment in that an insulating layer 41 and contact lines 43 and 35 are further provided, as shown in FIG. 9.

The insulating layer 41 is provided between the electrostrictive layer 15 and silicon layer 16. The contact line 43 penetrates the insulation layer 17, source/drain region 22N and insulating layer 41, and lies on the surface of the electrostrictive layer 15. The contact line 45 penetrates the insulation layer 17 and rests on the surface of the source/drain region 22P. The insulating layer 12 that functions for device isolation has such a depth as to penetrate the silicon layer 16, insulating layer 41 and electrostrictive layer 15 and to reach a point in the silicon layer 11.

A power supply voltage Vss (<power supply voltage Vdd) is applied to the contact line 43. A power supply potential Vdd (>substrate voltage Vsub) is applied to the contact line 45.

The thickness D3 of the insulating layer 41 is about 1/10 or less of the thickness D2 of the silicon layer 16.

The operation of the third embodiment is the same as that of the second embodiment, so a detailed description is omitted here.

According to the semiconductor device of the third embodiment, the same advantageous effects as with the first embodiment can be obtained. In addition, in the semiconductor device according to this embodiment, the insulating layer 41 is provided between the electrostrictive layer 15 and silicon layer 16, and the source/drain regions 22N and 22P are in contact with the upper part of the insulating layer 41.

Thus, advantageously, it is possible to prevent impurities in the source/drain regions 22N, 22P from diffusing and causing short-circuit between the channel regions 24N and 24P. Thus, malfunction of the transistor P1, N1 can be prevented.

The contact line 43 penetrates the insulating layer 17, source/drain region 22N and insulating layer 41, and lies on the surface of the electrostrictive layer 15. It is thus possible to apply a desired power supply voltage Vss to the surface of the electrostrictive layer 15N.

A method of manufacturing the semiconductor device of the third embodiment is described with reference to FIG. 10 to FIG. 13, taking the semiconductor device shown in FIG. 9 by way of example.

Figure 10:
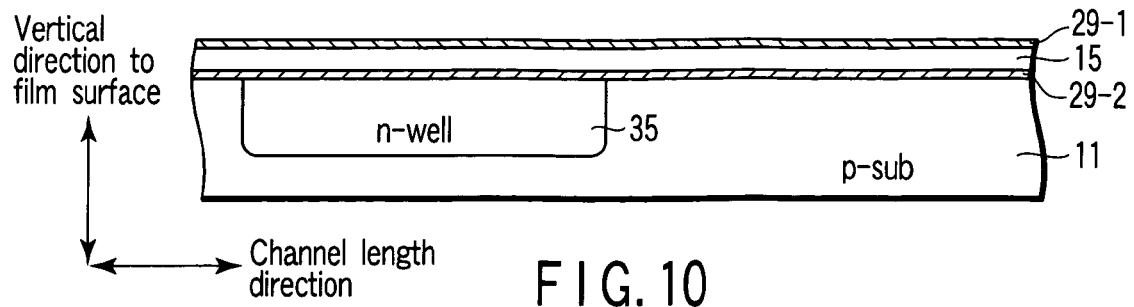
FIG. 10 is a cross-sectional view illustrating a fabrication step of the semiconductor device according to the third embodiment of the invention.

As is shown in FIG. 10, an n-well is formed in the silicon layer 11 and an electrostrictive layer 15 is formed on the silicon layer 11, by the same fabrication steps as in the second embodiment.

Figure 11:
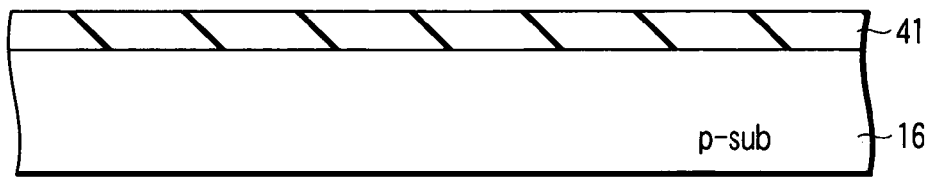
FIG. 11 is a cross-sectional view illustrating a fabrication step of the semiconductor device according to the third embodiment of the invention.

Separately from the silicon layer 11, a p-type silicon layer 16 is prepared, as shown in FIG. 11. The silicon layer 16 is subjected to, e.g. thermal oxidation, thereby to form a silicon oxide film ($SiO_2$). Thus, the insulating layer 41 is obtained.

Figure 12:
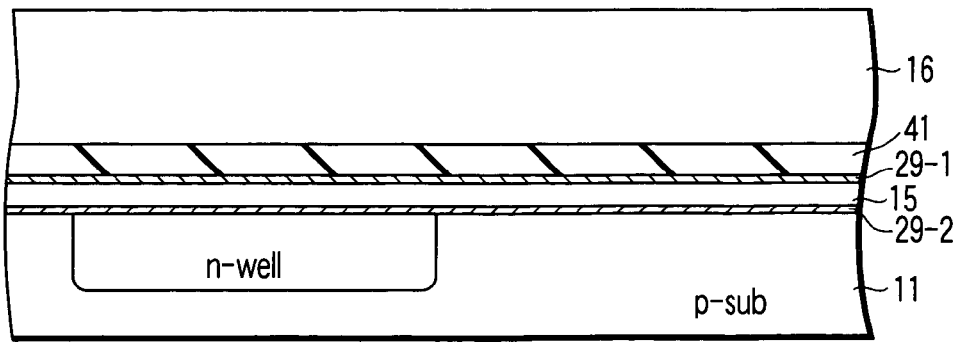
FIG. 12 is a cross-sectional view illustrating a fabrication step of the semiconductor device according to the third embodiment of the invention.

Then, as shown in FIG. 12, the silicon layer 16 with the insulating layer 41 is turned upside down, and the insulating layer 41 is attached to the electrostrictive layer 15.

Figure 13:
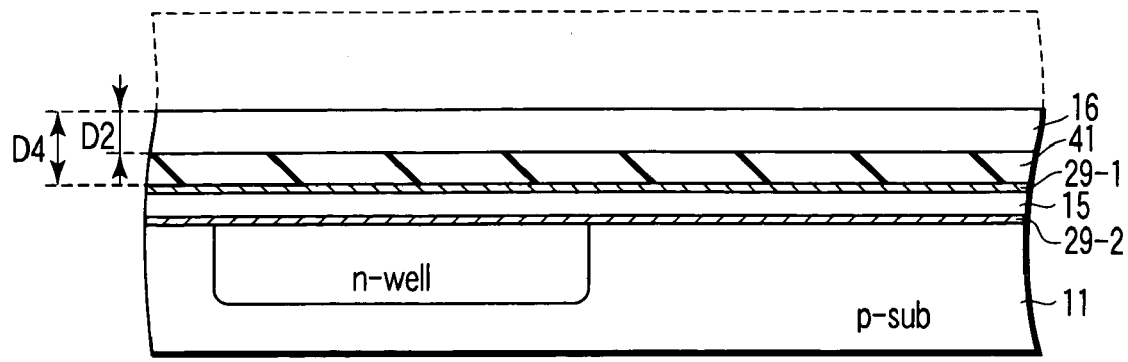
FIG. 13 is a cross-sectional view illustrating a fabrication step of the semiconductor device according to the third embodiment of the invention.

In a subsequent step illustrated in FIG. 13, the thickness of the silicon layer 16 is reduced to about D2 by, e.g. a smart-cut method or CMP.

Subsequently, using conventional process steps, transistors N1, P1, contact lines 43, 45, etc. are formed, and the semiconductor device shown in FIG. 9 is fabricated.

According to this manufacturing method, the same advantageous effects as with the first embodiment can be obtained.

Fourth Embodiment

Figure 14:
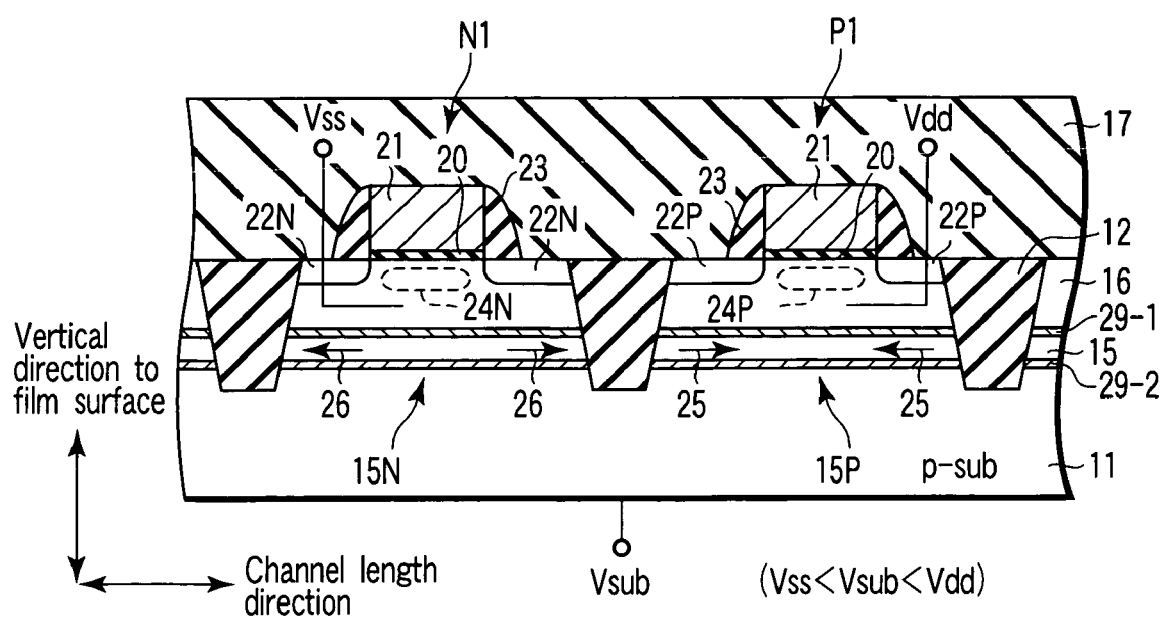
FIG. 14 is a cross-sectional view that shows a semiconductor device according to a fourth embodiment of the present invention.

Example in which Well Voltage Vss, Vdd and Substrate Voltage Vsub are Controlled Next, a semiconductor device according to a fourth embodiment of the invention is described with reference to FIG. 14. FIG. 14 is a cross-sectional view that shows the semiconductor device according to the fourth embodiment. A description of the parts, which are common to those in the first embodiment, is omitted.

The semiconductor device of the fourth embodiment differs from that of the first embodiment in that the n-well 35 is not provided in the silicon layer 11, as shown in FIG. 14.

When a substrate voltage Vsub is applied to the silicon layer 11, the substrate voltage Vsub is set to meet the condition, Vss<Vsub<Vdd.

According to the semiconductor device of the fourth embodiment, the same advantageous effects as with the first embodiment can be obtained. The structure of the fourth embodiment may be adopted, where necessary.

The method of manufacturing the semiconductor device of the fourth embodiment is substantially the same as in the first embodiment, so a detailed description is omitted. Since the formation of the n-well 35 is needless, the fabrication process can advantageously be simplified and the manufacturing cost can be reduced.

In the first to fourth embodiments, silicon layers 11, 16 are employed by way of example. The material of the semiconductor layers 11, 16 is not limited to silicon, and may be a compound semiconductor such as silicon germanium (SiGe). When a semiconductor layer including the compound semiconductor is used, the mobility of electrons or holes can advantageously be further enhanced. Moreover, there is a merit in fabrication in terms of heat, that is, higher temperatures can be used for the semiconductor layer.

In the first to fourth embodiments, the support substrate of the silicon layer 16/electrostrictive layer 15/silicon layer 11 is first formed, following which the transistor N1, P1 is fabricated. Alternatively, after the transistors N1, P1 are formed on the silicon layer 16, the electrostrictive layer 15/silicon layer 11 may be attached to the back side of the silicon layer 16 by the same fabrication steps as have been described above.

The three-layer structure of the support substrate, i.e. silicon layer 16/electrostrictive layer 15/silicon layer 11, is merely an example. Alternatively, the silicon layer 11 may be etched up to the back surface of the electrostrictive layer 15 and removed, and a support substrate including a two-layer structure of silicon layer 16/electrostrictive layer 15 may be adopted. In this case, the occupation area of the silicon layer 11 is saved, and this is advantageous for fine patterning.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first semiconductor layer;
    a first insulated-gate field-effect transistor of a first conductivity type that is provided in a major surface region of the first semiconductor layer; and
    an electrostrictive layer that is provided on a back surface of the first semiconductor layer and applies a first stress along a channel length to a channel region of the first insulated-gate field-effect transistor when the first insulated-gate field-effect transistor is operated.

2. The semiconductor device according to claim 1, further comprising:
    a second insulated-gate field-effect transistor of a second conductivity type that is provided in a major surface region of the first semiconductor layer, the second insulated-gate field-effect transistor including a channel region, to which a second stress along the channel length, which acts in a direction opposite to a direction of the first stress, is applied from the electrostrictive layer when the second insulated-gate field-effect transistor is operated.

3. The semiconductor device according to claim 2, wherein the electrostrictive layer applies the first stress or the second stress along the channel length to the channel region of each of the first and second insulated-gate field-effect transistors by application of electric fields in opposite directions perpendicular to a surface of the electrostrictive layer.

4. The semiconductor device according to claim 2, further comprising:
    a second semiconductor layer that is provided such that the second semiconductor layer and the first semiconductor layer sandwich the electrostrictive layer,
    each of the first and second insulated-gate field-effect transistors comprising:
    a gate electrode that is provided on the first semiconductor layer via a gate insulating film; and
    a source and a drain that are provided spaced apart in the first semiconductor layer such that the source and the drain sandwich the gate electrode, the source or the drain having bottoms in contact with the electrostrictive layer,
    wherein the electrostrictive layer applies the first stress along the channel length to the channel region of the first insulated-gate field-effect transistor by a voltage difference between a source voltage or a drain voltage of the first insulated-gate field-effect transistor and a voltage that is applied to the second semiconductor layer, and the electrostrictive layer applies the second stress along the channel length, which acts in a direction opposite to the first stress in the first insulated-gate field-effect transistor, to the channel region of the second insulated-gate field-effect transistor by a voltage difference between a source voltage or a drain voltage of the second insulated-gate field-effect transistor and a voltage that is applied to a well region provided in the second semiconductor layer.

5. The semiconductor device according to claim 2, further comprising:
a second semiconductor layer that is provided such that the second semiconductor layer and the first semiconductor layer sandwich the electrostrictive layer,
each of the first and second insulated-gate field-effect transistors comprising:
a gate electrode that is provided on the first semiconductor layer via a gate insulating film; and
a source and a drain that are provided spaced apart in the first semiconductor layer such that the source and the drain sandwich the gate electrode,
wherein the electrostrictive layer applies the first stress along the channel length to the channel region of the first insulated-gate field-effect transistor by a voltage difference between a voltage that is applied to the first semiconductor layer and a voltage that is applied to the second semiconductor layer, and
the electrostrictive layer applies the second stress along the channel length, which acts in a direction opposite to the first stress in the first insulated-gate field-effect transistor, to the channel region of the second insulated-gate field-effect transistor by a voltage difference between a voltage that is applied to the first semiconductor layer and a voltage that is applied to a well region provided in the second semiconductor layer.

6. The semiconductor device according to claim 2, further comprising:
a second semiconductor layer that is provided such that the second semiconductor layer and the first semiconductor layer sandwich the electrostrictive layer; and
an insulating layer that is provided between the electrostrictive layer and the first semiconductor layer,
each of the first and second insulated-gate field-effect transistors comprising:
a gate electrode that is provided on the first semiconductor layer via a gate insulating film; and
a source and a drain that are provided spaced apart in the first semiconductor layer such that the source and the drain sandwich the gate electrode, the source and the drain having bottoms in contact with the insulating layer,
wherein the electrostrictive layer applies the first stress along the channel length to the channel region of the first insulated-gate field-effect transistor by a voltage difference between a source voltage or a drain voltage of the first insulated-gate field-effect transistor and a voltage that is applied to the second semiconductor layer, and
the electrostrictive layer applies the second stress along the channel length, which acts in a direction opposite to the first stress in the first insulated-gate field-effect transistor, to the channel region of the second insulated-gate field-effect transistor by a voltage difference between a source voltage or a drain voltage of the second insulated-gate field-effect transistor and a voltage that is applied to a well region provided in the second semiconductor layer.

7. The semiconductor device according to claim 6, further comprising:
a first contact line that is provided on the source or the drain of the first insulated-gate field-effect transistor, and is supplied with a source voltage or a drain voltage; and
a second contact line that penetrates the source or the drain of the second insulated-gate field-effect transistor and the insulating layer, and lies on the electrostrictive layer, the second contact line being supplied with a source voltage or a drain voltage.

8. The semiconductor device according to claim 2, further comprising:
a second semiconductor layer that is provided such that the second semiconductor layer and the first semiconductor layer sandwich the electrostrictive layer,
each of the first and second insulated-gate field-effect transistors comprising:
a gate electrode that is provided on the first semiconductor layer via a gate insulating film; and
a source and a drain that are provided spaced apart in the first semiconductor layer such that the source and the drain sandwich the gate electrode, the source or the drain having bottoms in contact with the electrostrictive layer,
wherein the electrostrictive layer applies the first stress along the channel length to the channel region of the first insulated-gate field-effect transistor by a voltage difference between a source voltage or a drain voltage of the first insulated-gate field-effect transistor and a substrate voltage that is applied to the second semiconductor layer,
the electrostrictive layer applies the second stress along the channel length, which acts in a direction opposite to the first stress in the first insulated-gate field-effect transistor, to the channel region of the second insulated-gate field-effect transistor by a voltage difference between a source voltage or a drain voltage of the second insulated-gate field-effect transistor and the substrate voltage that is applied to the second semiconductor layer, and
a voltage value of the substrate voltage is between a voltage value of the source voltage or the drain voltage of the first insulated-gate field-effect transistor and a voltage value of the source voltage or the drain voltage of the second insulated-gate field-effect transistor.

9. The semiconductor device according to claim 1, wherein the electrostrictive layer is formed of a piezoelectric material.

10. The semiconductor device according to claim 1, wherein the electrostrictive layer includes at least one of PZT, AlN and ZnO.

11. The semiconductor device according to claim 2, further comprising:
a device isolation insulating layer that isolates the first semiconductor layer and the electrostrictive layer, which correspond to a region where the first insulated-gate field-effect transistor is formed, and the first semiconductor layer and the electrostrictive layer, which correspond to a region where the second insulated-gate field-effect transistor is formed.

12. The semiconductor device according to claim 2, wherein the first insulated-gate field-effect transistor is a pMOS transistor, the second insulated-gate field-effect transistor is an nMOS transistor, the first stress is a compressive stress, and the second stress is a tensile stress.

* * * * *